(12) United States Patent
Wang et al.

(10) Patent No.: US 9,632,125 B2
(45) Date of Patent: Apr. 25, 2017

(54) HARNESS ANOMALY DETECTION SYSTEMS AND METHODS

(71) Applicant: FORD GLOBAL TECHNOLOGIES, LLC, Dearborn, MI (US)

(72) Inventors: Xu Wang, Dearborn, MI (US); Chuan He, Northville, MI (US); Xiaoguang Chang, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 278 days.

(21) Appl. No.: 14/339,764

(22) Filed: Jul. 24, 2014

(65) Prior Publication Data

US 2016/0025789 A1    Jan. 28, 2016

(51) Int. Cl.
| | |
|---|---|
| *H02J 7/00* | (2006.01) |
| *G01R 31/00* | (2006.01) |
| *B60L 3/00* | (2006.01) |
| *B60R 16/02* | (2006.01) |
| *G01R 31/02* | (2006.01) |
| *G01R 27/08* | (2006.01) |

(52) U.S. Cl.
CPC .............. *G01R 31/007* (2013.01); *B60L 3/00* (2013.01); *B60R 16/0207* (2013.01); *G01R 27/08* (2013.01); *G01R 31/025* (2013.01)

(58) Field of Classification Search
USPC .......................................................... 320/104
See application file for complete search history.

(56) References Cited

U.S. PATENT DOCUMENTS

| | | | |
|---|---|---|---|
| 8,164,433 B2 | 4/2012 | Sivertsen | |
| 2013/0164573 A1* | 6/2013 | Williams | .............. B60L 11/187 429/50 |
| 2013/0245970 A1 | 9/2013 | Zhang | |
| 2015/0291055 A1* | 10/2015 | He | ....................... B60L 11/1874 429/50 |

FOREIGN PATENT DOCUMENTS

WO          0067359 A1      11/2000

* cited by examiner

*Primary Examiner* — Robert Grant
(74) *Attorney, Agent, or Firm* — David Kelley; Brooks Kushman P.C.

(57) ABSTRACT

A vehicle may include a traction battery, a harness electrically connected with the battery, and a controller programmed to generate harness anomaly output based on data indicative of historical resistances associated with the harness and temperature and state of charge data for the battery indicative of a current resistance associated with the harness.

15 Claims, 4 Drawing Sheets

US 9,632,125 B2

HARNESS ANOMALY DETECTION SYSTEMS AND METHODS

TECHNICAL FIELD

Disclosed herein are harness anomaly detection systems and methods.

BACKGROUND

Electric vehicles such as hybrid electric vehicles (HEV) or battery electric vehicles (BEV) may be powered by a traction motor and a high voltage battery. These high voltage batteries may include a large number of battery cells to accommodate the power demand of the vehicle. A wiring harness may connect the upper and lower parts of the battery to the respective vehicle systems and another wiring harness may connect battery cells in series.

During operation and over time, anomalies with the wiring harness may result in an increased harness resistance. It is desirable to know a resistance associated with a wire harness at a given time.

SUMMARY

A vehicle includes a traction battery, a harness electrically connected with the battery, and a controller programmed to generate harness anomaly output based on data indicative of historical resistances associated with the harness and temperature and state of charge data for the battery indicative of a current resistance associated with the harness.

A harness anomaly control system for a vehicle includes input channels configured to receive signals indicative of temperature and state of charge data for a traction battery, output channels configured to provide signals indicative of a harness anomaly, and control logic programmed to generate the signals indicative of the harness anomaly based on the temperature and state of charge data and historical harness resistance data.

A method for monitoring a wiring harness of a vehicle battery includes outputting, by at least one processor, harness anomaly data based on a comparison of historical resistances associated with the harness and a current resistance associated with the harness that is derived from temperature and state of charge data for the battery, and in response to the harness anomaly data, reducing a power limit for the battery.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompanying drawings in which:

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Described herein are harness anomaly detection systems and methods. These detection systems and methods may use a battery model to be implemented by the battery pack controller. Within the model, a series resistor may represent both the battery internal ohmic resistance and the battery harness resistance. An anomaly may be detected when an estimated value for the series resistor increases, as determined by comparing the estimated value with historical resistance values. The series resistance value may be estimated based on various model parameters determined using a Kalman filter.

Figure 1:
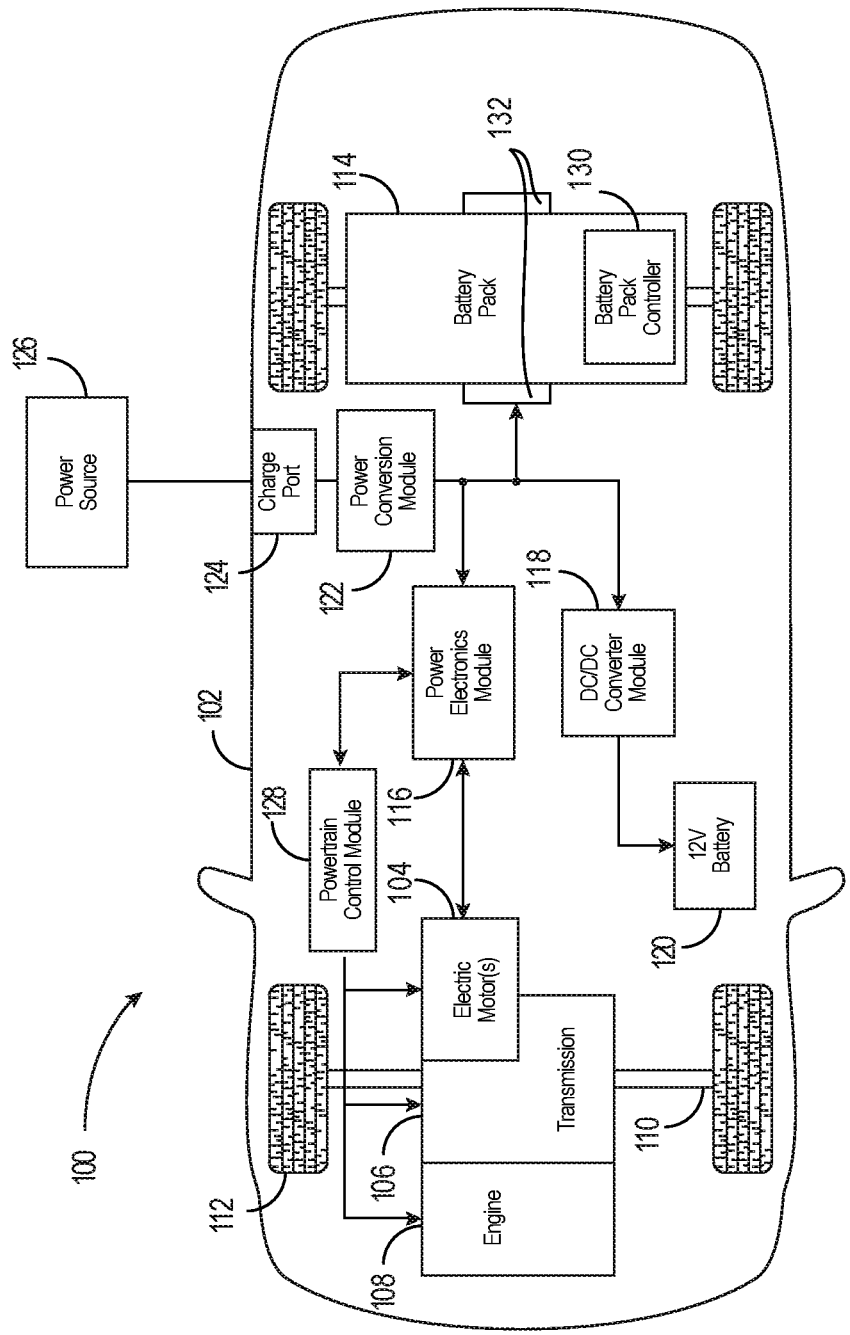
FIG. 1 illustrates an example hybrid-electric vehicle with a battery pack.

FIG. 1 illustrates an example of a vehicle 100. A plug-in hybrid-electric vehicle 102 may comprise one or more electric motors 104 mechanically connected to a hybrid transmission 106. In addition, the hybrid transmission 106 is mechanically connected to an engine 108. The hybrid transmission 106 may also be mechanically connected to a drive shaft 110 that is mechanically connected to the wheels 112. The electric motors 104 can provide propulsion when the engine 108 is turned off (e.g., vehicle works in electric vehicle mode). The electric motors 104 can provide deceleration capability when the plug-in hybrid-electric vehicle 102 slows down. The electric motors 104 may be configured as generators and can provide fuel economy benefits by recovering energy that would normally be lost as heat in the friction braking system. The electric motors 104 may also reduce pollutant emissions since the plug-in hybrid-electric vehicle 102 may be operated in electric vehicle mode under certain conditions.

A battery pack 114 (also referred to as battery 114) may store energy that can be used by the electric motors 104. A vehicle battery pack 114 typically provides a high voltage DC output. The battery pack 114 is electrically connected to a power electronics module 116. The power electronics module 116 is also electrically connected to the electric motors 104 and provides the ability to bi-directionally transfer energy between the battery pack 114 and the electric motors 104. For example, a typical battery pack 114 may provide a DC voltage while the electric motors 104 may require a three-phase AC current to function. The power electronics module 116 may convert the DC voltage to a three-phase AC current as required by the electric motors 104. In a regenerative mode, the power electronics module 116 will convert the three-phase AC current from the electric motors 104 acting as generators to the DC voltage required by the battery pack 114. The methods described herein are equally applicable to a pure electric vehicle or any other device using a battery pack.

In addition to providing energy for propulsion, the battery pack 114 may provide energy for other vehicle electrical systems. A typical system may include a DC/DC converter module 118 that converts the high voltage DC output of the battery pack 114 to a low voltage DC supply that is compatible with other vehicle loads. Other high voltage loads, such as compressors and electric heaters, may be connected directly to the high-voltage bus from the battery pack 114. In a typical vehicle, the low voltage systems are electrically connected to a 12V battery. An all-electric vehicle may have a similar architecture but without the engine 108.

The battery pack 114 may be recharged by an external power source 126. The external power source 126 may provide AC or DC power to the plug-in hybrid-electric vehicle 102 by electrically connecting through a charge port 124. The charge port 124 may be any type of port configured to transfer power from the external power source 126 to the plug-in hybrid-electric vehicle 102. The charge port 124 may be electrically connected to a power conversion module 122. The power conversion module 122 may condition the power from the external power source 126 to provide the proper voltage and current levels to the battery pack 114. In some applications, the external power source 126 may be configured to provide the proper voltage and current levels to the battery pack 114 and the power conversion module 122 may not be necessary. The functions of the power conversion module 122 may reside in the external power source 126 in some applications. The vehicle engine, transmission, electric motors and power electronics may be controlled by a powertrain control module (PCM) 128.

Figure 4:
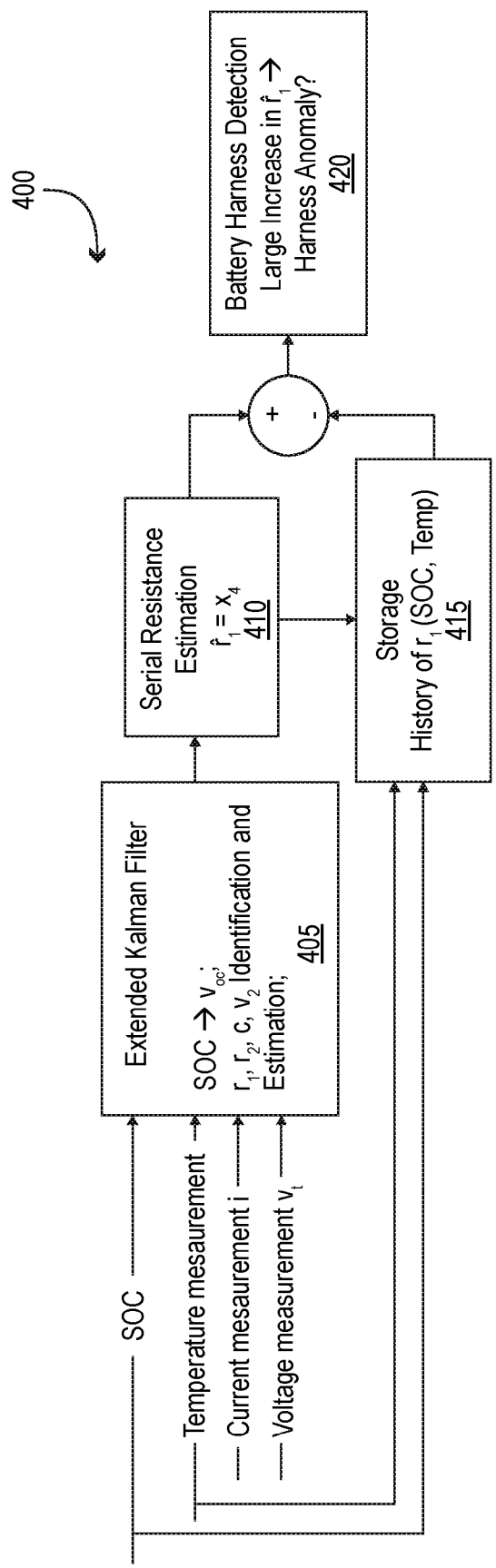
FIG. 4 illustrates a block diagram for a harness anomaly detection system.

The battery pack 114 may also include a battery pack controller 130 (also referred to as controller 130). The battery pack controller 130 may include a battery equivalent circuit model 400 (as shown in FIG. 4) to detect harness anomalies. The battery pack controller 130 may be a battery energy control module (BECM) and may control and monitor the performance of the battery pack 114.

The battery pack 114 may include a battery harness 132 connecting the upper and lower parts of the battery to the respective battery systems such as the power conversion model 122, the power electronics module 116 and the converter module 118. During operation of the battery, the harness 132 may have a harness resistance. The harness resistance may increase due to environmental factors such as vibration, humidity, rusting, solder failures, etc. The increase in harness resistance may have a negative impact on the battery pack 114. For example, it may harm the vehicle's E-mileage and lower fuel economy.

In addition to illustrating a plug-in hybrid vehicle, FIG. 1 may also illustrate a battery electric vehicle (BEV), a traditional hybrid electric vehicle (HEV) and a power-split hybrid electric vehicle. The various components discussed may have one or more associated controllers (including the battery pack controller 130) to control and monitor the operation of the components. The controllers may communicate via a serial bus (e.g., Controller Area Network (CAN)) or via discrete conductors.

Figure 2:
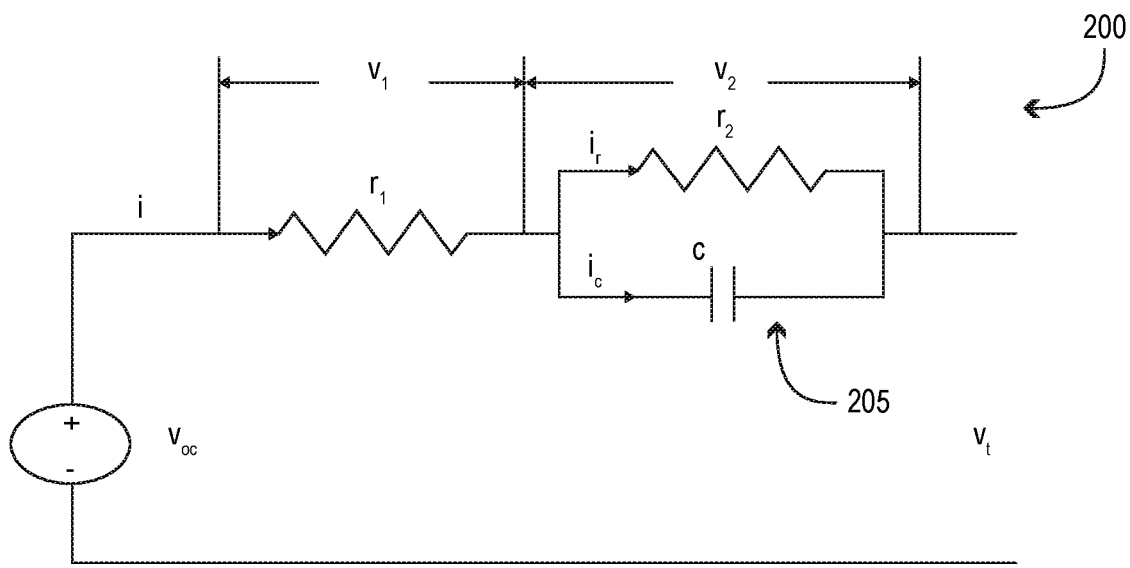
FIG. 2 illustrates an equivalent circuit model for the vehicle battery pack/cell.

FIG. 2 illustrates an equivalent circuit model (ECM) 200 (also referred to as model 200) for the vehicle battery pack 114. While the model 200 is described herein with respect to the pack 114 in a pack level application, it may also be applicable to the individual cells within the battery pack 114 in a cell level application. The model 200 includes a simplified Randel's circuit that includes a serial resistor $r_1$ in series with an RC circuit 205 including a parallel resistor $r_2$ and a parallel capacitor C. The serial resistor $r_1$ may include both a battery internal ohmic resistance and a battery harness resistance. The model 200 may include a battery open circuit voltage (OCV) $V_{oc}$. The open circuit voltage $V_{oc}$ may be derived from the state of charge (SOC) of the battery by using the relationship between the SOC and the OCV. This derivation is described in more detail with respect to FIG. 3.

The model 200 may include voltages $V_1$, $V_2$ across each of the series resistor $r_1$ and the RC circuit 205, respectively. A battery terminal voltage $V_t$ (also referred to as a measured battery voltage) may be measured by a voltage sensor. A battery current i may be measured by a current sensor. Also shown on FIG. 2 are a resistor current $i_r$, and a capacitor current $i_c$, where $i=i_c+i_r$.

The voltages $V_2$ and $V_{OC}$ may be represented by the below equations:

$$\dot{v}_2 = -\frac{1}{r_2 c} v_2 + \frac{i}{c} \qquad (1)$$

$$v_{oc} - v_t = v_2 + i r_1 \qquad (2)$$

The model parameters $r_1$, $r_2$, C and $V_2$ (serial resistance, parallel resistance, parallel capacitance and parallel voltage, respectively) may be identified via an identification method. In one example, the method may include an extended Kalman filter (EKF) method. The EKF method may be highly accurate with in identifying the serial resistance $r_1$. When the battery OCV is in a normal range with respect to the battery temperature T, the serial resistance $r_1$ may be used for harness anomaly detection. That is, the serial resistance $r_1$ may be used as an indicator of an anomaly within the battery harness 132.

An EKF system state may be represented by:

$$x = [x_1 \ x_2 \ x_3 \ x_4]' = \left[ v_2 \ \frac{1}{r_2 c} \ \frac{1}{c} \ r_1 \right]' \qquad (3)$$

An EKF system output may be represented by:

$$y = v_{ov} - v_t = v_2 + i r_1 \qquad (4)$$

A corresponding discrete state space model of the EKF system may be represented by:

$$x(k+1) = f(x(k), i(k)) \qquad (5)$$

$$y(k+1) = h(x(k+1), i(k+1)) \qquad (6)$$

where:

$$f(x(k), i(k)) = \begin{bmatrix} (1 - T_s x_2(k)) x_1(k) + T_s x_3(k) i(k) \\ x_2(k) \\ x_3(k) \\ x_4(k) \end{bmatrix} \qquad (7)$$

$$h(x(k+1), i(k+1)) = x_1(k+1) + x_4(k+1) i(k+1) \qquad (8)$$

where $T_s$ is the EKF sampling period and k is the discrete time step index.

To apply the EKF, equations 5 and 6 may be linearized. The Jacobians of equation 5 may be:

$$\left. \frac{\partial f}{\partial x} \right|_{x(k), i(k)} = \begin{bmatrix} 1 - T_s x_2(k) & -T_s x_1(k) & T_s i(k) & 0 \\ 0 & 1 & 0 & 0 \\ 0 & 0 & 1 & 0 \\ 0 & 0 & 0 & 1 \end{bmatrix} \text{ where} \qquad (9)$$

$$F(k) = \left. \frac{\partial f}{\partial x} \right|_{x(k), i(k)}$$

The Jacobians of equation 6 may be:

$$\left.\frac{\partial h}{\partial x}\right|_{x(k),i(k)} = [1\ 0\ 0\ i(k)] \quad (10)$$

where $H(k) = \left.\frac{\partial h}{\partial x}\right|_{x(k),i(k)}$

An EKF recursion calculation for state x estimation may be determined. Once the EKF converges, from equation (3), the serial resistance may be estimated as $\hat{r}_1 = x_4$. The convergence of the EKF may be influenced by the choice of the starting values that are used to initialize the EKF. Convergence may be detected when a sequence of distance values based on the estimated ECM parameters ($r_1$, $r_2$, and C) are decreasing and the final distance value of the sequence is below a threshold, as described in more detail below for block 520 of FIG. 5.

Figure 3:
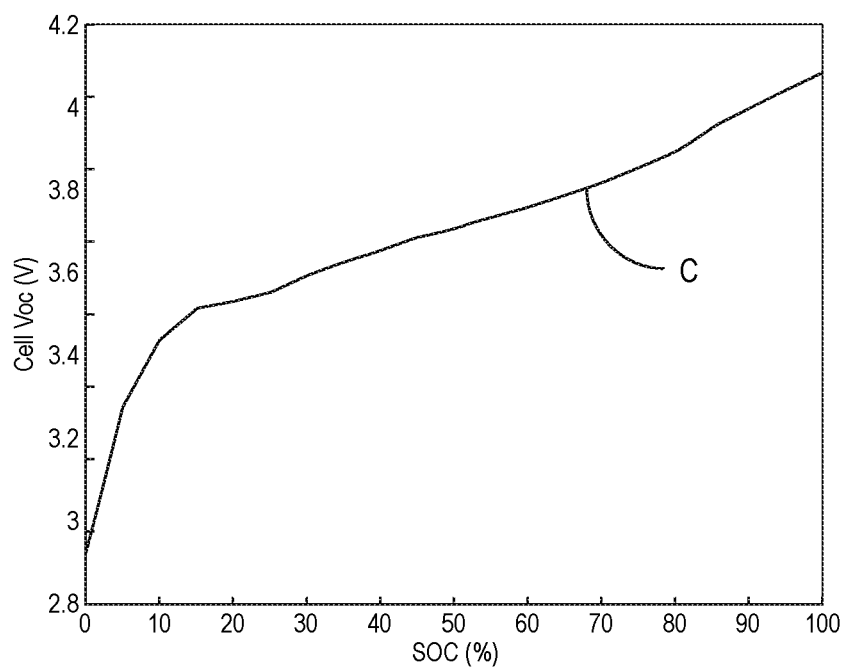
FIG. 3 illustrates a chart showing a relationship between a battery state of charge and a battery open circuit voltage.

FIG. 3 illustrates a chart showing a relationship between the battery SOC in percentages and the battery OCV ($V_{oc}$) in volts (V). As indicated in the curve C in the chart, as the SOC increases, so does the $V_{oc}$. The relationship between SOC and $V_{oc}$ may be obtained from an analysis of battery properties or from testing the battery cells. The relationship may be implemented as a table lookup or an equivalent equation. The exact shape of the curve may vary based on the exact formulation of the Lithium-Ion battery. The voltage $V_{oc}$ changes as a result of charging and discharging of the battery 114.

FIG. 4 illustrates a block diagram for a harness anomaly detection system 400. The system 400 may be facilitated by a controller having a processor and a memory. In one example, the controller may be the battery pack controller 130. The controller may also be within one of the vehicle modules 116, 122, 128. The system 400 may include an EKF block 405, a serial resistance estimation block 410, a storage block 415, and a harness increase detection block 420.

The EKF block 405 may be programmed to receive various filter inputs. Such inputs may include one or more dynamic filter inputs such as the battery SOC, a battery temperature T, battery current i and battery terminal voltage $V_t$. Upon receiving the various filter inputs, block 405 may apply the EKF to identify values for $r_1$, $r_2$, C and $V_2$ of the model.

Block 410 may then use the identified values for x for the serial resistance estimation of $\hat{r}_1 = x_4$.

Block 415 may store each of the values of $\hat{r}_1$ in a memory within or accessible by the controller. Other values associated with the estimated resistance $\hat{r}_1$ may also be stored, such as the SOC, temperature T, among others. In application, the serial resistance $r_1$ may change as the battery temperature T and SOC change. Historic values of $r_1$ as each relate to a certain battery temperature T and SOC, may be recorded in the memory (e.g., EEPROM).

At block 420, these stored historic values for $r_1$ may be recalled and compared to the most recent estimation of $\hat{r}_1$. This comparison may aid in the harness anomaly detection, as described in more detail below with respect to FIG. 5.

Figure 5:
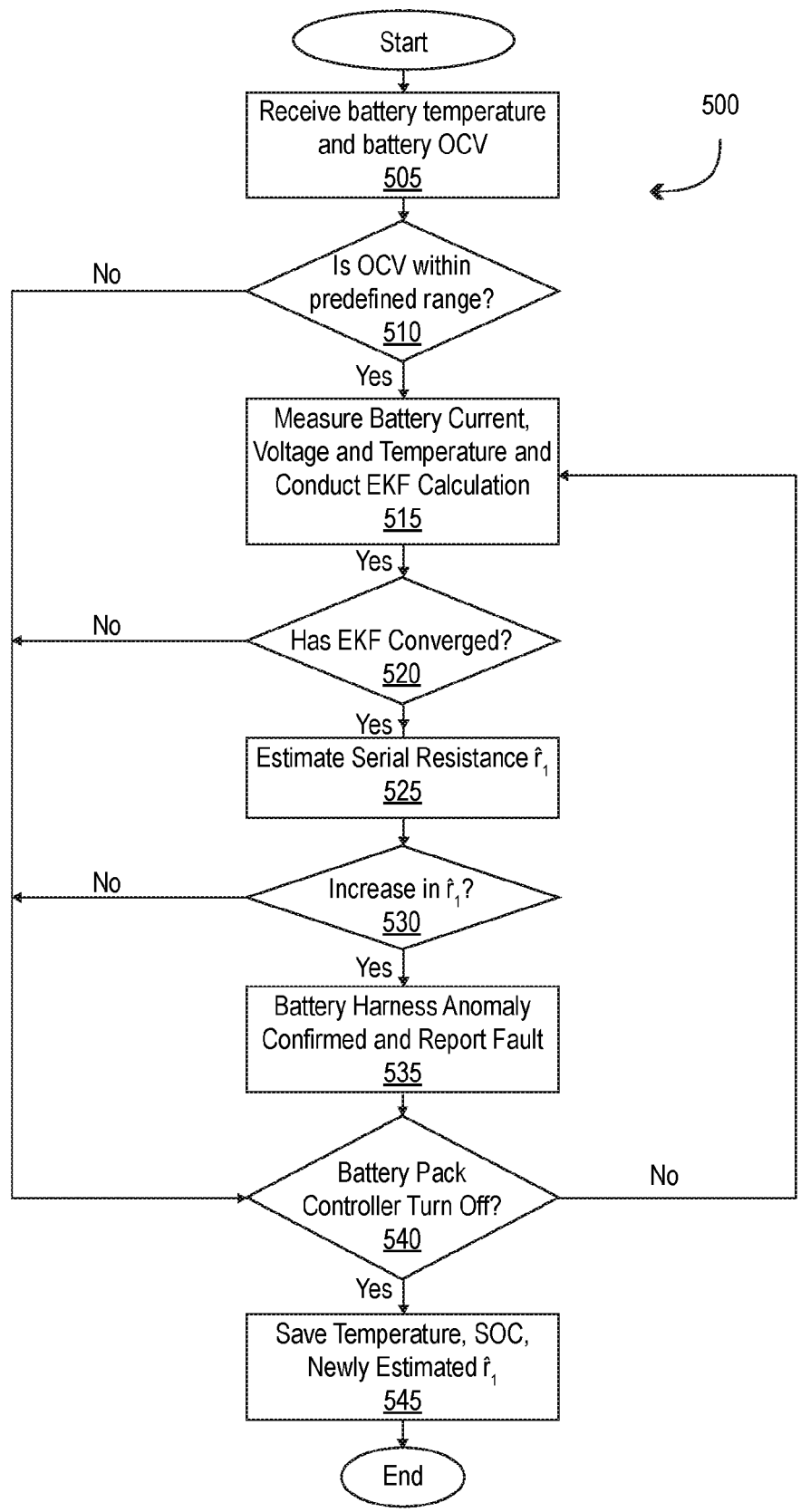
FIG. 5 illustrates a process for the harness anomaly detection system.

FIG. 5 illustrates a process 500 for the harness anomaly detection system 400. The process begins at block 505, where the controller may read the battery SOC and the historical values of the resistance from nonvolatile memory, e.g. EEPROM. Historical resistance values may be organized in a historical resistance table in terms of battery temperature T and SOC. An example of a historical resistance table is shown below by Table 1. Block 505 may also receive the measured battery temperature T and the measured battery $V_{oc}$. Note that at key on, when this is no battery usage, i.e. there is no current going through battery, and battery voltage already relaxes for some time (e.g. 10 minutes), the measured battery terminal voltage $V_t$ is the battery $V_{oc}$.

TABLE 1

| Temp/SOC | 0% | 10% | 20% | 30% | 40% | 50% | 60% | 70% | 80% | 90% | 100% |
|---|---|---|---|---|---|---|---|---|---|---|---|
| −40° C. | 0.6218 | — | — | — | — | 0.5240 | — | — | — | 0.3800 | 0.6500 |
| −30° C. | 0.0460 | — | — | — | — | 0.0153 | — | — | — | 0.0212 | 0.0221 |
| −20° C. | 0.0230 | — | — | — | — | 0.0088 | — | — | — | 0.0099 | 0.0096 |
| −10° C. | 0.0120 | — | — | — | — | 0.0044 | — | — | — | 0.0046 | 0.0050 |
| 0° C. | 0.0120 | — | — | — | — | 0.0031 | — | — | — | 0.0033 | 0.0039 |
| 10° C. | 0.0041 | — | — | — | — | 0.0022 | — | — | — | 0.0021 | 0.0020 |
| 20° C. | 0.0033 | — | — | — | — | 0.0021 | — | — | — | 0.0020 | 0.0019 |
| 30° C. | 0.0028 | — | — | — | — | 0.0015 | — | — | — | 0.0022 | 0.0020 |
| 40° C. | 0.0025 | — | — | — | — | 0.0014 | — | — | — | 0.0020 | 0.0018 |
| 45° C. | 0.0024 | — | — | — | — | 0.0016 | — | — | — | 0.0020 | 0.0018 |
| 50° C. | 0.0023 | — | — | — | — | 0.0016 | — | — | — | 0.0019 | 0.0017 |
| 60° C. | 0.0022 | — | — | — | — | 0.0015 | — | — | — | 0.0018 | 0.0016 |

At block 510, the controller may determine whether the battery $V_{oc}$ is within a predefined range with respect to the measured temperature T. For example, at 25 degrees Celsius, the battery $V_{oc}$ for 45% SOC may be between 3.66V and 3.70V for a single battery cell. If the battery $V_{oc}$ is within the predefined range, that is, if the battery's internal chemistry is good at key on and the abnormal increase of the battery identified internal resistance is more likely due to the harness anomaly, the process 500 may proceed to block 515. If not the process 500 may proceed to block 540.

At block 515, the battery current i, voltage $V_t$ and temperature T are measured and used in EKF calculation for ECM parameter identification, as described above.

At block 520, the controller may determine whether the EKF has converged. After executing the EKF, the convergence of the EKF may be ascertained at block 520. Several mechanisms may be used for determining the convergence of the EKF. One example is to use a smoothing filter, such as a Savitzy-Goray filter, to obtain filtered values $\theta_{sg}$ of the EKF estimates $\theta_{ekf} = [r_1, r_2, C]$. A distance between the raw estimated values of $\theta_{ekf}$ and the filtered estimated values $\theta_{sg}$ for each step m may be calculated as:

$$d(m) = \Sigma_{k \in [1,M]} w_k (\theta_{sg} - \theta_{ekf})^2 \quad (11)$$

where, for example, M=3 is the total number of ECM parameters estimated by the EKF and $w_k$ is a set of predetermined weighting factors. A sequence of d(m) values may be evaluated for convergence. The sequence of d(m) values may be constructed as the last $M_z$ outputs of the EKF and the filter, where $M_z$ may be a calibratable number. $M_z$ represents the number of points used in determining the EKF learning convergence. The EKF may have converged if the sequence is decreasing and the last value in the sequence is less than a calibrated value d_cal and the process may proceed to block 525. Otherwise, the EKF may not have converged yet and the process 500 may proceed to block 540.

At block 525, the controller may estimate the serial resistance $r_1$ using the EKF calculation results. The estimated serial resistance $r_1$ may be estimated based, at least in part, on the battery temperature T.

At block 530, the controller may compare the estimated serial resistance $\hat{r}_1$ with historic values of $r_1$ at a similar temperature and SOC. If the comparison shows an increase of the estimated serial resistance $\hat{r}_1$ over the historical values of $r_1$, the process may proceed to block 535. If not, the process may proceed to block 540 where the historical resistance table is updated based on estimated serial resistance $\hat{r}_1$, temperature T, and SOC of battery. Determining the increase of the estimated serial resistance $\hat{r}_1$ over the historical values $r_1$ may include several calculations. For example, the average of the historical values may be taken and then compared to the estimated serial resistance $\hat{r}_1$. Additionally or alternatively, the highest historical value for $r_1$ may be compared to the estimated serial resistance $\hat{r}_1$. The difference between the historical value(s) of $r_1$ and the estimated serial resistance $\hat{r}_1$ may then be compared to a predefined increase value. The predefined increase value may be a larger increase value (e.g., an increase in 0.5 ohms at temperature of 25 degrees Celsius for pack level applications). Thus, if the difference between the estimated serial resistance $\hat{r}_1$ increases and the historical values for $r_1$ exceeds the predefined increase value, the process may proceed to block 535.

At block 535, the controller may report a battery harness anomaly fault. Once harness anomaly fault is detected, the controller 130 may take one or more remedial actions. For example, the controller may instruct fan to increase speed in order to provide more cool air and decrease heat generated by the increased resistance due to the harness anomaly. Additionally or alternatively, the controller 130 may relax or adjust a corresponding fault detection threshold/limit associated with other vehicle fault detection systems (e.g., overcharge and/or over discharge fault detection systems) in an effort to avoid false alarms for the other fault detection systems. For example, the pack/cell voltage threshold for overcharge and over discharge systems may be increased a when harness anomaly is detected and located. The controller 130 can also ignite the wrench and/or engine lamps to inform customer that battery harness is faulted. The controller 130 may also reduce the battery power limits to decrease heat generation.

Notably, harness anomaly detection may be applied to a battery pack 114 as a whole at a pack level application, as well as to individual cells within a battery pack 114 at a cell level application. In reference to FIG. 2, the open circuit voltage $V_{oc}$ may be a sum of all battery cell's OCV during the pack level application. During the cell level application, the $V_{oc}$ of FIG. 2 may represent the individual cell's OCV, or the sum of the cell's OCV in the same subset within the battery 114. For the cell level application, harness anomalies may not only be detectable, but also located and isolated to a specific cell or subset of cells. Accordingly, the harness 132 around a specific cell may be identified as being faulty. Similarly, the controller 130 may also take remedial actions based on anomalies detected in only a subset of the battery cells. For example, the voltages for these faulted cells may not be considered when determining the SOC correction for these battery cells' SOC calculations.

At block 540, the controller may determine whether the controller 130 has been turned off, e.g. vehicle keys off. If the controller 130 has been turned off, the process proceeds to block 545. If not, the process 500 returns to block 515.

At block 545, the controller may save the estimated serial resistance $\hat{r}_1$ and the battery temperature T and battery SOC associated therewith for future determinations. That, is the estimated serial resistance $\hat{r}_1$ is now saved as one of the historical values $r_1$.

During operation, the EKF may consume memory and a central processing unit (CPU) load. If the controller is not capable of conducting ECM identification for all battery cells concurrently, the identification may be conducted one by one. In a typical system 400, the EKF converges very fast. Thus, in the example where the ECM identification for each battery cell is done separately, the looping continues until each cell's ECM identification is complete. Each cell's harness anomaly detection may be conducted individually based on its own estimated serial resistance $\hat{r}_1$.

Accordingly, a system for determine a harness anomaly detection is described herein. The anomaly detection may be achieved using an estimated resistance value based on temperature and SOC of a battery. Additional hardware may not be necessary for this detection at least because an EKF may be used to identify certain ECM parameters. The anomaly detection may be achieved in real-time or near real-time and may be applicable for the life of the battery. The detection is considered highly accurate and may be implemented via on board diagnostics (OBD) and other battery power related diagnostics, both in-range and out of range. It may be used by both manufacturers and vehicle dealerships as a dealer tool to detect possible loose connections of the harness.

Increased harness resistance my cause the battery pack power to be consumed. This generates additional heat, which may cause a fan used to cool the battery to operate more frequently. The fan may consume more energy due to the high resistance. Thus, the battery power may be lowered and the vehicle performance and fuel economy will suffer.

Computing devices described herein generally include computer-executable instructions, where the instructions may be executable by one or more computing devices such as those listed above. Computer-executable instructions may be compiled or interpreted from computer programs created using a variety of programming languages and/or technologies, including, without limitation, and either alone or in combination, Java™, C, C++, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

With regard to the processes, systems, methods, heuristics, etc., described herein, it should be understood that, although the steps of such processes, etc., have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A vehicle comprising:
   a traction battery;
   a harness electrically connected with the battery; and
   a controller programmed to generate harness anomaly output based on data indicative of historical resistances associated with the harness and temperature and state of charge data for the battery indicative of a current resistance associated with the harness.

2. The vehicle of claim 1, wherein the output is further based on parameters indicative of the current resistance and wherein the parameters are based on measured currents and voltages of the battery.

3. The vehicle of claim 2, wherein the parameters include a series resistance, a parallel resistance, a capacitance, or a voltage defining an equivalent circuit model of the battery.

4. The vehicle of claim 3, wherein the controller is further programmed to identify the parameters via an Extended Kalman filter.

5. The vehicle of claim 4, wherein the controller is further programmed to identify the parameters in response to convergence of the Extended Kalman filter.

6. The vehicle of claim 1, wherein the controller is further programmed to take a remedial action in response to the harness anomaly output, wherein the remedial action includes instructing a fan speed to increase, adjusting thresholds for other vehicle fault detection systems, or reducing a power limit for the battery.

7. A harness anomaly control system for a vehicle comprising:
   input channels configured to receive signals indicative of temperature and state of charge data for a traction battery;
   output channels configured to provide signals indicative of a harness anomaly; and
   control logic programmed to generate the signals indicative of the harness anomaly based on the temperature and state of charge data and historical harness resistance data.

8. The system of claim 7, wherein the signals indicative of the harness anomaly are further based on parameters that are based on measured currents and voltages of the traction battery.

9. The system of claim 8, wherein the parameters include a series resistance, a parallel resistance, a capacitance or a voltage defining an equivalent circuit model of the traction battery.

10. The system of claim 9, wherein the control logic is further programmed to identify the parameters via an Extended Kalman filter.

11. The system of claim 10, wherein the control logic is further programmed to identify the parameters in response to convergence of the Extended Kalman filter.

12. A method for monitoring a wiring harness of a vehicle battery comprising:
    outputting, by at least one processor, harness anomaly data based on a comparison of historical resistances associated with the harness and a current resistance associated with the harness that is derived from temperature and state of charge data for the battery; and
    in response to the harness anomaly data, reducing a power limit for the battery.

13. The method of claim 12, wherein the current resistance is further derived from parameters that are based on measured currents and voltages of the battery.

14. The method of claim 13, wherein the parameters include a series resistance, a parallel resistance, a capacitance and a voltage defining an equivalent circuit model of the battery.

15. The method of claim 14 further comprising identifying the parameters in response to convergence of an Extended Kalman filter.

* * * * *